United States Patent [19]

Booth et al.

[11] Patent Number: 4,460,421
[45] Date of Patent: Jul. 17, 1984

[54] METHODS OF AND APPARATUS FOR INDEXING A REPETITIVELY PATTERNED STRIP PAST A PLURALITY OF WORK STATIONS

[75] Inventors: Raymond H. Booth, Walnutport; Jack J. Monahan, Allentown; Fred J. Schneider, Northampton, all of Pa.

[73] Assignee: AT&T Technologies, Inc., New York, N.Y.

[21] Appl. No.: 444,951

[22] Filed: Nov. 29, 1982

[51] Int. Cl.³ .............................................. B23P 21/00
[52] U.S. Cl. ..................................... 156/64; 156/351; 156/361; 156/556; 156/552; 226/2; 226/27; 226/32; 226/139; 226/141; 226/162
[58] Field of Search .................. 226/27, 45, 32, 2, 62, 226/64, 141, 158, 162–163, 139; 156/361, 556, 522, 552, 64, 378, 351; 29/740

[56] References Cited

U.S. PATENT DOCUMENTS

| | | | |
|---|---|---|---|
| 2,578,960 | 12/1951 | Alger | 226/32 |
| 2,653,024 | 9/1953 | Jones | 226/32 |
| 2,721,649 | 10/1955 | Powers | 226/141 |
| 2,968,430 | 1/1961 | Martin et al. | 226/162 X |
| 3,289,507 | 12/1966 | Grewe | 226/162 X |
| 3,448,280 | 6/1969 | Blitchington et al. | 250/227 |
| 3,475,805 | 11/1969 | Rottmann | 29/203 |
| 3,564,568 | 2/1971 | Bunner | 29/407 X |
| 3,698,620 | 10/1972 | Geyer et al. | 29/577 X |
| 3,724,068 | 4/1973 | Galli | 228/47 X |
| 3,778,889 | 12/1973 | Mason | 29/596 |
| 3,893,217 | 7/1975 | Edmond | 29/407 |
| 3,914,356 | 10/1975 | Dombiak et al. | 625/113 X |
| 3,946,931 | 3/1976 | Bahack et al. | 228/105 X |
| 4,029,536 | 6/1977 | Kovacs et al. | 156/285 |
| 4,079,509 | 3/1978 | Jackson et al. | 29/589 |
| 4,236,301 | 12/1980 | Hug et al. | 29/740 |

Primary Examiner—David A. Simmons
Attorney, Agent, or Firm—W. O. Schellin

[57] ABSTRACT

In methods of and apparatus (28) for indexing a repetitively patterned strip (12) past a plurality of work stations, such as, for example, a bonding station (33) and a dewebbing station (65) of a lead frame bonder, a cyclical, automated adjustment of the strip (12) with respect to the bonding station (33) eliminates repeated meticulous manual fine adjustments of the strip. An adjustment of the position of the strip (12) is achieved by adjusting the positions of travel limit stops (109 and 111) of an incremental feed mechanism (46). Simultaneously with the adjustment of the travel limit stops (109 and 111), an adjustment is made in the same magnitude and in the same direction as the adjustment to the limit stops in the position of the dewebbing station (65). Similar adjustments may be made to any other station, an accurate position of which with respect to the position of the strip (12) is desirable.

13 Claims, 7 Drawing Figures

METHODS OF AND APPARATUS FOR INDEXING A REPETITIVELY PATTERNED STRIP PAST A PLURALITY OF WORK STATIONS

TECHNICAL FIELD

This invention relates to indexing a repetitively patterned strip, such as a strip of electrical lead frames, past a plurality of sequentially arranged work stations. The indexing operation involves an incremental advance of the strip to move predetermined portions of the strip sequentially into spacial relationship, such as a desired alignment, with the work stations. Thus, in summary, the invention relates to methods of incrementally advancing the strip and to apparatus for advancing the strip to bring about a desired position of such predetermined portions of the strip relative to the stations.

BACKGROUND OF THE INVENTION

The present invention is particularly described in relationship to a type of apparatus known as a lead frame bonder. Lead frame bonders are used in the semiconductor industry to bond interconnecting leads to either semiconductor chips or to small support substrates bearing semiconductor chips. Before the leads become bonded to the chips or to such substrates supporting the chips, the leads are typically clustered in a pattern about a central bond location. The positions of the leads in each cluster relative to each other are fixed by tie bars or interconnecting metal strips located adjacent to inner bond ends of the leads and about the outer periphery of each cluster of leads. The outer tie bars further define the outer edges of each frame.

A copending patent application by R. H. Booth et al., Ser. No. 225,562, filed Jan. 16, 1981, and assigned to the assignee of this application, relates to a substrate handling technique and apparatus which presents substrates in groups of two at a bonding station of a lead frame bonder. In contradistinction, the present invention relates to handling a strip of lead frames to which such substrates are to be bonded. Consequently, the apparatus described herein, in its preferred mode, advances a strip by increments of two lead frames to cooperate with the substrate handling provisions in the copending application. However, the magnitude of the feed increment of the strip is not of significance to the present invention. The significance of this invention includes, instead, a capability to achieve precise alignment of the strip at a plurality of work stations after each of consecutive indexing operations in spite of variations in the pitch of the lead frames.

In the past, it has been difficult to maintain a precise adjustment of the lead frames at the bonding station. Typically, a strip of lead frames is pulled past the bond station of the bonding apparatus by a hitch feed mechanism. A hitch feed mechanism is an intermittent motion mechanism or incremental feed mechanism which indexes the strip in predetermined increments to align with the bonding station unbonded lead frames which follow previously bonded lead frames of the strip.

The feed mechanism of the bonding apparatus typically follows the bonding station when the spacial arrangement of the apparatus is viewed in the direction of travel of the strip, such that the strip is pulled past the bond station. For the lead frames to become precisely aligned at the bonding station after each indexing movement, the distance between the bonding station and the feed mechanism, and the travel limits of the feed mechanism should relate precisely to the pitch of, or spacing between, a predetermined number of the frames in the strip. It has been found, however, that after an initial setup adjustment of the travel limits of the feed mechanism, a slight misalignment of the lead frames at the bond station tends to occur once the apparatus has assumed continuous operation. Thus, a readjustment of the apparatus may become necessary after the apparatus has been operated for some time. If one or more work stations follow the feed mechanism, further adjustments on any such subsequent work stations may also become necessary.

SUMMARY OF THE INVENTION

Thus, a repetitively patterned strip is indexed past a plurality of work stations by first sensing the position of a pattern in the strip relative to a desired position with respect to a first work station. A determination is then made whether there exists a deviation of the sensed position of the pattern from the desired position of the pattern with respect to such first work station. The strip is incremented by an indexing movement of a mechanism travelling between two travel limit stops of the mechanism. When a determination has been made that a said deviation does exist, the position of the travel limit stops is adjusted by an increment to decrease any such deviation of the sensed position of the pattern. Simultaneously with any adjustment of the travel limit stops at least one second work station is adjusted in the same direction and by an increment of the same magnitude as the travel limit stops.

BRIEF DESCRIPTION OF THE DRAWING

Various features and advantages of the invention will be best understood when the detailed description is read in reference to the accompanying drawing, wherein.

DETAILED DESCRIPTION

The Strip

Figure 1:
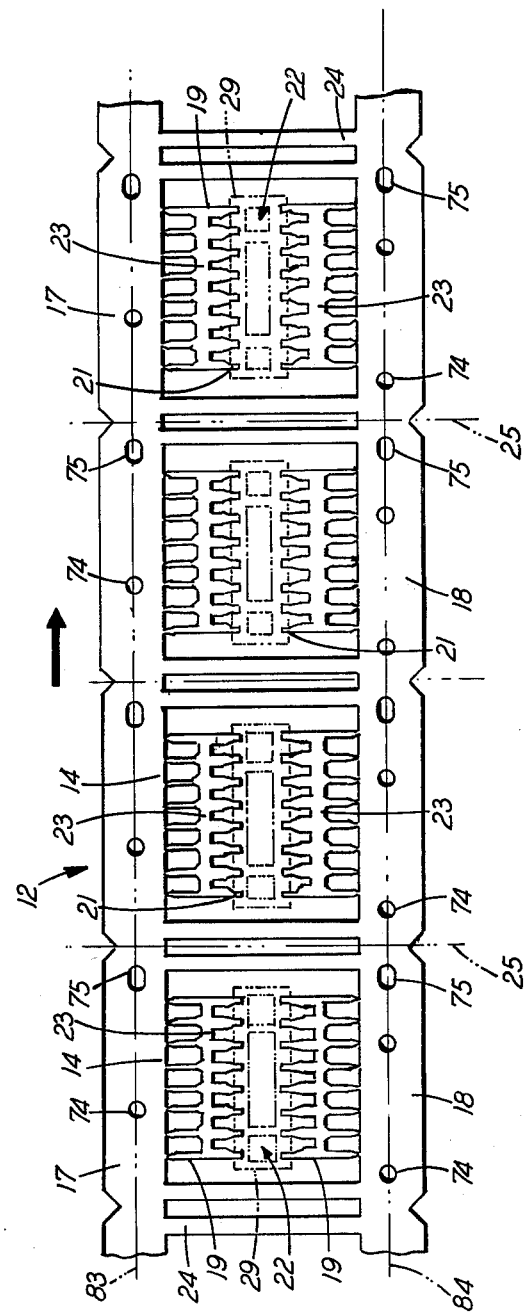
FIG. 1 is a portion of a typical lead frame as an example of a patterned strip, the feeding, handling and control of which in a manufacturing apparatus is improved by the features and advantages of this invention.

FIG. 1 shows a portion of a typical strip 12 of sequentially formed lead frames 14. The strip 12 is typically dispensed from a reel 16 (see FIG. 2) and routed to desired processing operations. Each frame 14 in the strip 12, as shown in FIG. 1, is structurally identical to all other frames 14 in the strip. Thus, generally described, the strip 12 is a repetitively patterned strip. Thus, it should be realized, the various features for handling, and for operating on, the strip 12 of lead frames 14 in accordance with this invention can be applied to similar handling operations on other repetitively patterned strips.

Each one of the frames 14 shown in FIG. 1 features two parallel, comparatively wide outer rails 17 and 18. These rails and the corresponding rails of the adjacent frames 14 form the lateral boundaries of the strip 12. Extending inward from rails 17 and 18 is a group of leads 19, such that inner ends 21 of the leads 19 point toward a common space 22 in the center of the lead frame 14. The inner ends 21 of the leads 19 are further held in position within the frame 14 and particularly with respect to each other by an inner web 23. The inner web 23 ties the leads 19 in each row of leads to each other, such that only a short portion of the inner end 21 extends inward beyond the inner web 23.

The outer rails 17 and 18 are spaced from each other by cross ties 24. A single one of such cross ties 24 suffices to space the rails 17 and 18 and to maintain each recurring frame pattern the same as the pattern of each of the other frames 14. However, severing the strip 12 into portions at the end of a frame 14 would leave one frame 14 at either a leading or a trailing end of such severed portion without one of the cross ties 24, unless such single cross tie is actually cut along its center line. The strip 12 in FIG. 1, consequently, shows two adjacent, parallel running cross ties 24 such that the strip 12 may be severed into short portions along a cutting line 25 between two of the frames 14. Both frames 14 on either side of the cutting line 25 retain one of the cross ties 24.

The Apparatus in General

Figure 2:
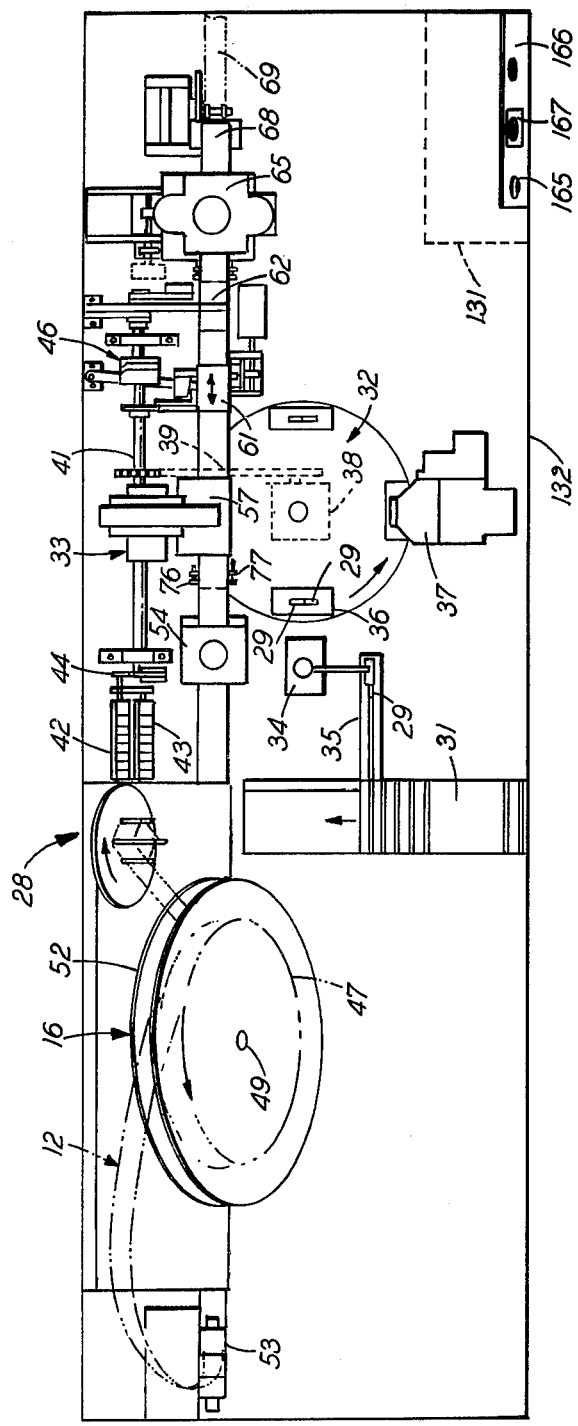
FIG. 2 is a top view of apparatus showing a sequential arrangement of a plurality of work stations which include features of this invention.

FIG. 2 shows a top view of an apparatus, designated generally by the numeral 28 which, in the described embodiment, carries out several operations to assemble a hybrid integrated circuit substrate 29 to each of the lead frames 14 as shown in FIG. 1. The substrate 29 is also shown (in phantom lines) in FIG. 1 in relationship to the leads 19 of each of the lead frames 14.

Referring back to FIG. 2, the operation of the apparatus 28 involves, in general, feeding the strip 12 in increments of two of the frames 14 at a time, and feeding the substrates 29 in groups of two from a magazine 31 to a rotary table 32. The table 32 advances the substrates 29 into alignment with respective lead frames 14 at a bonding station 33. The above-mentioned application, Ser. No. 225,562, filed Jan. 16, 1981, by Booth et al., describes various features and operations of advancing substrates, such as the substrates 29 herein, to a bonding station such as the bonding station 33 of the apparatus 28.

The presently described apparatus 28 shows modifications over the apparatus of the application Ser. No. 225,562 which result in a different mode of loading the substrates 29 onto the rotary table 32. For example, a swing arm type loader 34 (see FIG. 2) is used in the presently described, preferred apparatus to reorient the substrates 29 by 90 degrees in transferring them from a feed track 35 to a nest 36 on the table 32. The reorienting motion of the swing arm type loader 34 replaces a linearly extensive movement of a similar load arm of the load mechanism as is, for example, described in the referred-to application. Once loaded onto the table 32, the substrates 29 advance by incremental motion of the table 32 past a centering station 37 to the bonding station 33.

A main drive mechanism 38 is located beneath the rotary table 32 to advance the table 32, as indicated by the arrow in FIG. 2. A chain drive 39 driven by the main drive mechanism 38 powers a drive shaft 41 in timed relationship with the mechanism 38. Two conventional banks of cam switches 42 and 43 are coupled through a timing belt 44 to the drive shaft 41 to generate control signals in response to predetermined shaft positions of the drive shaft 41. Such control signals may be processed to start operational cycles of independently powered work stations in relationship to the cycle of the bonding station 33 and to an index feed mechanism 46 which are both directly powered by the drive shaft 41.

As shown in FIG. 2, the strip 12 is stored in a coil 47 on the reel 16. The reel 16 is mounted at an incline. Such inclined orientation of the reel 16 has been found to have several advantages. First, gravity is used to take up play of the reel 16 against a shoulder and thrust bearing on the shaft 49, such that a lower side plate 52 of the reel remains precisely oriented with respect to the shoulder on the shaft 49. Furthermore, the coiled strip 12 rests against such lowermost side plate 52 of the reel 16, such that, as the strip 12 is dispensed from the reel 16, the strip is and remains precisely located in the slanted plane of the side plate 52, to permit the strip 12 to be fed with virtually no lateral reciprocating movement or variation into a strip guide assembly 53.

The slanted reel position provides other advantages similar to those of a horizontally oriented reel. For example, the reel 16 need not be fastened to the shaft 49. However, the slanted reel position has an additional space saving advantage of a vertically mounted dispensing reel. A preferred slanted mounting of 30 degrees off the vertical further limits a necessary twist in the strip 12 to permit the strip 12 to assume the flat orientation in the horizontal plane without undue stress.

Passing through the guide assembly 53, the strip 12 is shown to advance past a first station, such as a notching station 54. The notching station 54 is an optional punch and die station which may operate, for example, to longitudinally cut the strip 12 just ahead of the bonding station 33. The notching station 54 may, however, be deleted from the apparatus 28, if so desired. The presence of the notching station 54 is shown in FIG. 2 to illustrate that additional work stations may be added in sequence with other work stations described herein.

As shown in FIG. 2, the strip 12 advances to the bonding station 33. In the described, preferred embodiment the strip is advanced with an incremental movement whereby the strip is indexed in steps of two lead frames, and two lead frames 14 replace two prior lead frames under a dual frame bonding head 57.

The incremental feed of the strip 12 is generated by the index feed mechanism or incremental feed mechanism, which has been referred to generally by the numeral 46. The feed mechanism 46 is preferably located adjacent to the bonding station 33. The feed mechanism 46, in general, includes a cam operated rectilinear feed head 61 and a clamping head 62 which is also cam operated. The clamping head 62 retains the position of the strip 12 when the feed head 61 becomes disengaged from the strip 12 to reciprocatably return in the direction of the bonding station 33 prior to grasping two subsequent lead frames 14 in a subsequent indexing movement.

The feed mechanism 46 incrementally pulls the strip 12 through the bonding station 33 and pushes the strip 12 on toward a dewebbing station 65. The dewebbing station 65 is, in essence, a punch and die mechanism through which the strip 12 is indexed in the preestablished increments of two of the lead frames 14 at a time. After a substrate 29 has been bonded to the inner ends 21 of the leads 19, the inner webs 23 are no longer needed to hold the leads 19 in relation to each other (as can be seen from a reference to FIG. 1). The ends 21 are now firmly bonded to the respective substrates 29. The inner webs 23 are consequently cut away between the individual leads 19 such that, except for the tips of each of the leads being attached to the outer rails, the leads 19 extend independently of each other from the substrate 29.

Referring back to FIG. 2, from the dewebbing station 65, the strip 12 advances to a cut-off station 68 at which the indeterminate length of the strip 12 is cut into strip segments 69 of a predetermined length. A length of eight lead frames 14 in each such segment of the strip 12 is typically a convenient length to handle the lead frames 14 in subsequent processing steps.

Problems of aligning the lead frames 14 at bonding stations of prior art bonding apparatus were overcome by a set-up operator who would meticulously align feed limits of strip feed mechanisms similar to the mechanism 46. In such prior art apparatus, a subsequent adjustment of such feed limits of the feed mechanism often became necessary after a brief start-up run of the apparatus because of thermal expansion of the strip 12 in its contact with a bonding heater of its respective bonding station.

Figure 3:
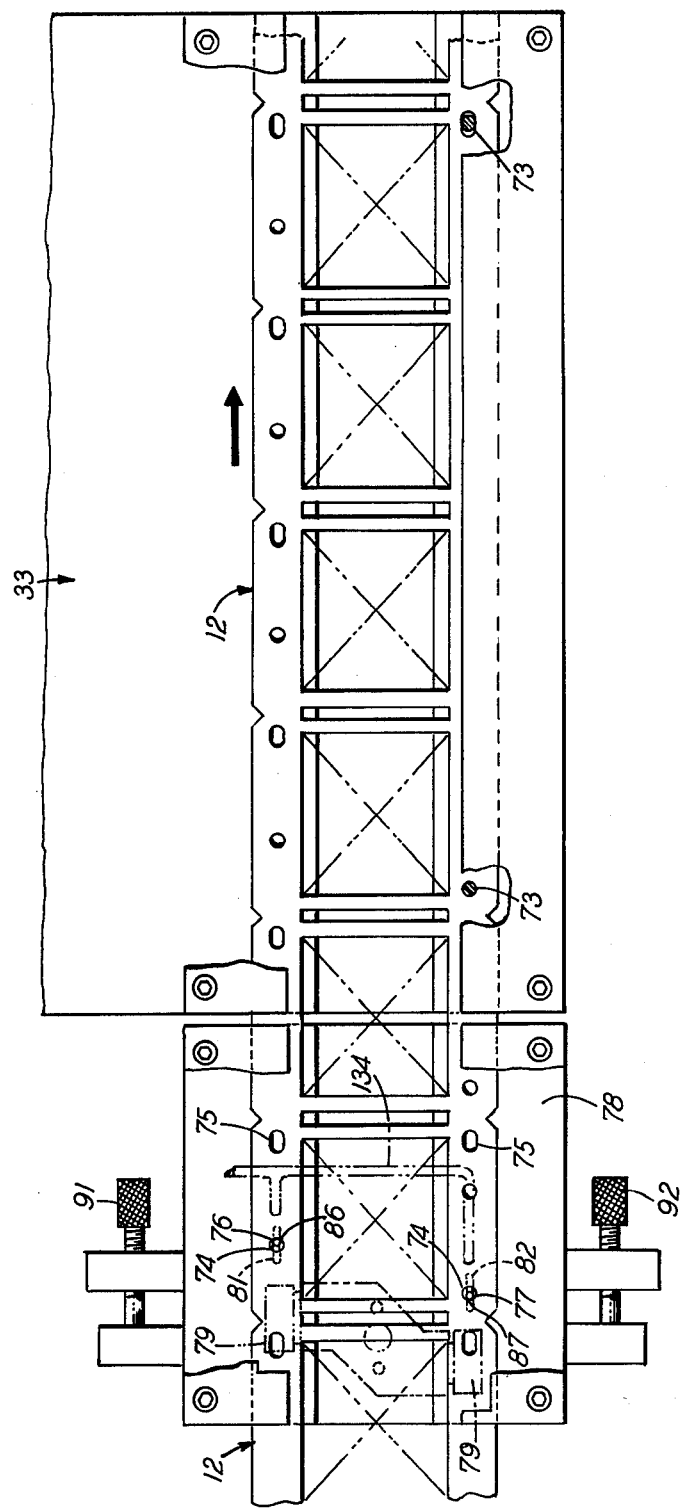
FIG. 3 is an enlarged top view of a portion of a bonding station shown in FIG. 2, highlighting two optical sensors which are mounted adjacent to the bonding station in cooperative relationship to patterned features of the strip in FIG. 1, such as feed holes in the strip of lead frames.

To correct small deviations from a precise alignment of the strip 12 at a bonding station, it has been the practice in the prior art to engage locating pins, such as pins 73 (FIG. 3), the locations of which are shown in section in the top view of FIG. 3, with feed holes 74 and alignment slots 75 in the outer rails 17 and 18 of the strip 12. However, some larger misalignments of the strip 12 at such bonding station have been found to cause the engaging pins to enlarge engaged feed holes during their engagement. Such enlargement of the feed holes 74 tends to occur when the pins shave the walls of the holes and cause burrs in attempting to move the strip 12. The strip is then typically moved less than the full desired increment and the burrs cause an increase in friction and hence an increase in resistance to the efforts to index the strip. Any such misalignment of the strip 12 because of enlarged feed holes ultimately tends to become more pronounced as the strip 12 is advanced. An existing error tends to increase because the burrs and the enlarged feed holes contribute to an even greater misalignment when the enlarged feed holes 74 become engaged by the feed mechanism.

The Strip Alignment

Referring now to FIG. 3, there are shown two electro-optical signal generators or sensors 76 and 77 mounted in a track portion 78. The track portion 78 is mounted to the apparatus 28 adjacent to the bonding station 33 and serves to guide the strip 12 into the bonding station 33. The sensors 76 and 77 may be any of a variety of commercially available units, such as, for example, a fiber optics scanner, Model S-2005, sold by SKAN-A-MATIC Corp. of Elbridge, N.Y. A fiber optics scanner type of sensor has been found to fit into narrow spaces. The sensors 76 and 77 are furthermore capable of sensing the position of an edge of an object with a repeated accuracy with less than 0.025 mm error. The accuracy of sensing a hole position may be affected. A pressure roller assembly 79 (shown in phantom lines) may be mounted above the track portion 78 to retain the strip 12 biased against the top surface of the track portion 78, to thereby locate the strip 12 at a consistently precise distance above a pair of apertures 81 and 82. The use of the pressure roller assembly 79 has been found to increase the accuracy of the sensors 76 and 77. The sensors 76 and 77 respond to a reflection of a light output through their respective apertures 81 and 82 with a first type of electrical signal and to the absence of a reflection from such light output with a second type of electrical signal. For example, when a light output from the sensor 76 through its respective aperture 81 strikes a portion of the metallic strip 12 and is consequently reflected back into the aperture 81, the result becomes a positive voltage or a "1" signal from the sensor 76. If, however, the light is not reflected back into the aperture 81, the signal output from the sensor 76 then becomes an electrical ground or "zero."

Preferably, the sensors 76 and 77 are located in spaced relationship to each other beneath opposite sides of the track portion 78 in alignment with centerlines 83 and 84 (see FIG. 1) through the feed holes in the respective outer rails. The positions of the sensors 76 and 77 are adjustable in the direction of longitudinal movement of the strip 12. Consequently, the positions of the sensors are also adjustable with respect to each other in the direction of the movement of the strip. A correct alignment according to the preferred embodiment of FIG. 3 positions the aperture 81 beneath the outer rail 17 at the leading edge 86 of the periphery of the feed hole 74 when two of the lead frames 14 are precisely located in alignment with two of the substrates 29 at the bonding station 33. The second aperture 82 is correspondingly located within the corresponding feed hole 74 in the outer rail 18 and at the trailing edge 87 of its periphery.

The sensors 76 and 77 are adjusted in their longitudinal direction to become aligned to the edges of the feed holes 74, as shown in FIG. 3. An initial alignment of the sensors 76 and 77 is readily made by placing a portion of the strip 12 with two frames 14 into alignment with the bonding station 33 and then adjusting the position of the sensors 76 and 77 relative to the feed holes 74 of such aligned strip. The sensors 76 and 77 are preferably adjusted by turning respective micrometer screws 91 and 92. The precision of the adjustment is aided by watching (with the aid of standard electrical test instruments, not shown) for transitions in electrical signals generated by the sensors during the adjustment. As each of the sensors 76 or 77 is moved from a position out of alignment with the respective feed hole 74 to just inside the feed hole, the sensed output signal from the respective sensor suddenly switches from a "logic high" to a "logic low" state. In the preferred embodiment, an additional quarter turn of the micrometer screw adds a 0.025 mm tolerance band to the otherwise precise adjustment. The second of the sensors 76 and 77 is then brought into position from the opposite direction of the strip 12 in the same manner.

The established relationship between the strip 12, the sensors 76 and 77 and the bonding station thereby makes it possible to know through the electrical signal from the sensors 76 and 77, whether the lead frames 14 of the strip 12 are in alignment with the bonding station 33. Furthermore, if a small misalignment of less than the diameter of the feed holes 74 exists, high and low states of signal outputs from the sensors 76 and 77 indicate in which direction the strip 12 needs to be moved to reestablish the precise alignment of the frames 14 at the bonding station 33. The information generated by the sensors 76 and 77 is advantageously used, not only to monitor the alignment of the lead frames 14 at the bonding station 33, but also to maintain a correct alignment of the lead frames as they are repetitively advanced toward the bonding station.

The Index Feed Mechanism

Figure 4:
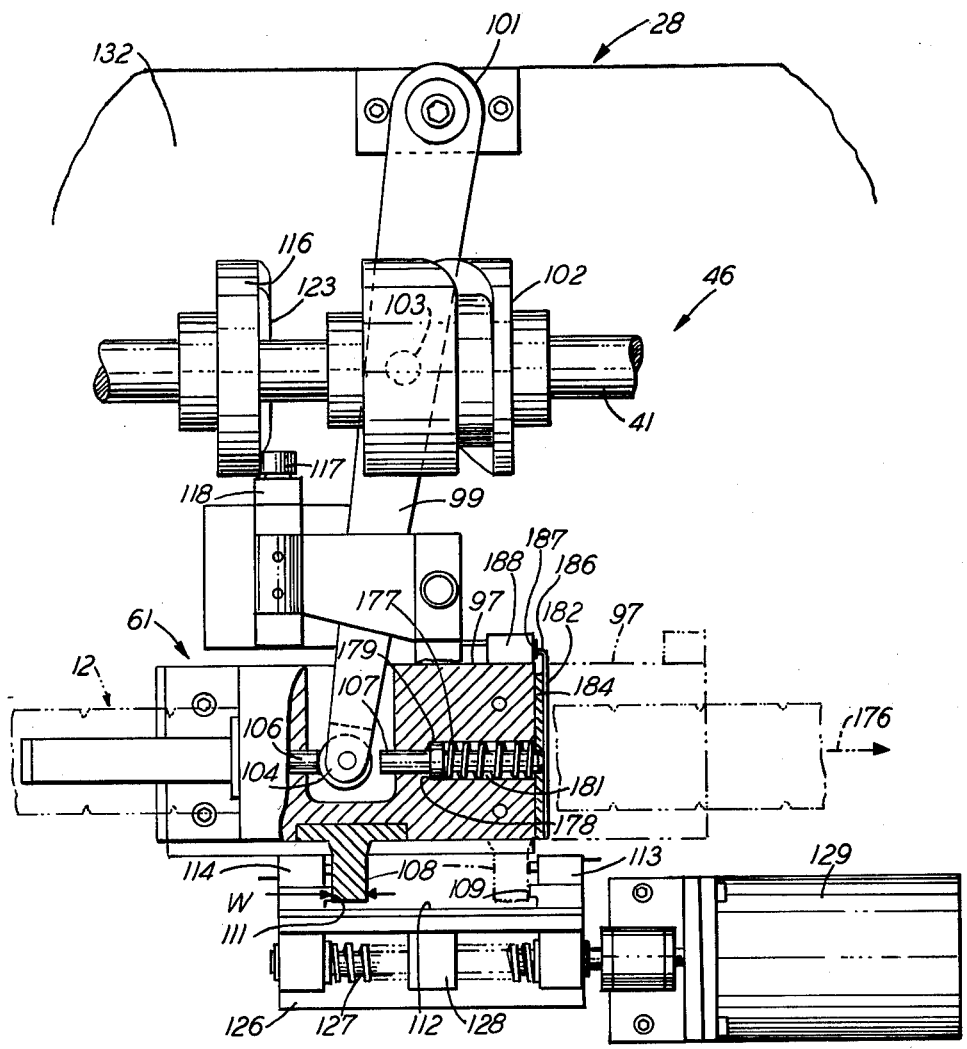
FIG. 4 is a top view of an index feed mechanism of the apparatus in FIG. 2, showing various features of this invention.

FIG. 4 depicts in greater detail the index feed mechanism 46. A linearly reciprocating movement along the length of the strip 12 is executed by the feed head assembly 61. The feed head assembly 61 includes a strip support block 97 which is linearly movable on a rail 98 (see FIG. 5). A reciprocating movement of the strip support block 97 is generated by a lever 99 which is pivotally mounted to the apparatus 28 at one end 101 and reciprocated by a barrel cam 102 mounted to the drive shaft 41 as seen in FIG. 4. A cam follower 103 which is mounted to a mid section of the lever 99, engages the barrel cam 102. A free end 104 of the lever 99 is thereby permitted to reciprocatingly drive the support block 97 through contact with two opposed, inwardly spring-loaded drive pins 106 and 107.

A precise drive pitch, corresponding in the preferred embodiment to the combined lengths of two lead frames 14, is determined by a free length of travel of a projection 108 extending from the support block 97 between a forward stop 109 and back stop 111 of a yoke 112. Facing surfaces of the forward and back stops 109 and 111 of the yoke 112 are precisely machined such that an open space between the two stops corresponds to the desired pitch of two lead frames 14 plus the width "W" of the projection 108.

To assure that the support block 97 travels the full distance permitted by the spacing between the stops 109 and 111, the travel of the cam 102 provides for an overtravel of the free end 104 of the lever 99 of approximately 1 mm at each end of its travel. The additional travel of the free end 104 of the lever 99 is absorbed by a resilient yield in the respective spring-loaded drive pin 106 or 107.

The reciprocating movement of the support block 97 is, with properly adjusted travel limits, capable of moving two lead frames 14 at a time into alignment with the bonding station 33. To monitor the location of the travel limits of the support block 97 in relationship to the bonding station 33 as the movement of the block advances a strip 12, limit switches 113 and 114 are mounted to the forward and back stops 109 and 111, respectively. The transfer points of the switches 113 and 114, namely the points at which the switches open or close, are adjusted to be positioned close to the actual contact of the projection 108 with the respective stop. Any overtravel of the projection 108 past the transfer point of the respective switch is preferably limited to about 0.1 mm.

The limit switch 114 on the backstop 111 generates monitoring signals which are used for initially identifying the position of the support block 97 at which the strip 12 is engaged.

The limit switch 113, mounted to the forward stop 109, indicates the position of the support block 97 at which the strip 12, after having been pulled the distance of two lead frames, becomes disengaged by the feed head 61.

Figure 5:
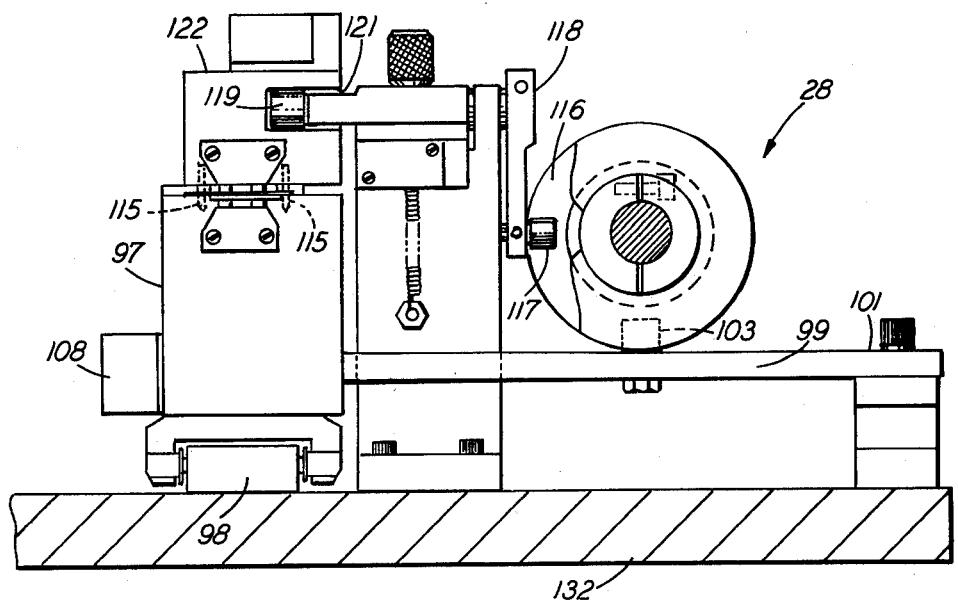
FIG. 5 is an end view of the index feed mechanism shown in FIG. 4.

FIG. 5 shows feed pins 115 which engage and disengage the feed holes 74 of the strip 12 (see also FIG. 1) during each index cycle of the strip 12. Vertical motion of the pins 115 is generated by a face cam 116 which is engaged by a cam follower 117 of a bell crank 118. A driving end 119 of the bell crank 118 rides in a guide track 121 of a vertically translatable jaw 122 mounted to the support block 97. The jaw 122 and the driving end 119 of the bell crank 118 are spring-loaded downward. Thus, as the cam follower moves off a cam lobe 123, the jaw 122 is permitted to move downward to grasp the strip 12. The pins 115 extending downward from the lower surface of the jaw 122 toward the support block 97 move through the respective feed holes 74 in the strip 12 to engage the strip 12 during such spring-driven downward movement of the jaw 122. The downward movement of the jaw 122 occurs at a time during the feed cycle when the projection 108 has moved against the back stop 111.

The engagement of the strip 12 by the feed pins 115 is followed by the index movement of the feed head 61, namely the support block 97 and the jaw 122 holding the strip. At the end of the index movement when the projection 108 rests in contact with the forward stop 109 (as shown in phantom lines in FIG. 4), the cam 116 drives the bell crank 118 against the spring force of the jaw to raise the jaw 122 and thereby disengage the pins 115 from the strip 12. While the clamping head 62 (see FIG. 2) engages and holds the strip 12 in place, the feed head 61 is freed from the strip to return toward the back stop 111 for the next incremental bite on the strip 12.

An initial precise adjustment of the travel limits of the feed head 61 appears to ensure a repetitively precise advance of the strip 12. However, it has been discovered that thermal expansion of the lead frames 14 at the bonding station and possibly other unknown variables tend to introduce alignment errors into the strip 12.

Automatic Strip Alignment

The described apparatus 28 (see FIG. 2), however, includes an advantageous control mechanism for minimizing alignment variations of the lead frames 14 between the bonding station 33 and the index feed mechanism 46. Such control mechanism is applicable to minimize alignment variations between the strip 12 and work stations which may be located along the path of the indexed strip 12 such as, for example, the dewebbing station 65.

Referring again to FIG. 4, the yoke 112 is slidably mounted to a fixed base 126 and becomes thereby adjustable in parallel to the direction of the reciprocating movement of the support block 97. A precision lead screw 127 engages an internally threaded lug 128 on the yoke 112, such that a rotation of the lead screw 127 effects an adjustment of the yoke 112 and, hence, of the travel limits of the feed head 61.

The lead screw 127 is preferably driven by a typical stepping motor 129, such that the lead screw 127 may be pulsed through a predetermined fraction of each revolution. A stepping motor requiring, for example, 100 steps for each revolution controls the motion of the lead screw 127 to cause its pitch to shift the position of the yoke 112 by an increment of 0.025 mm for each pulse of the stepping motor 129.

When during the operation of the apparatus 28 the sensors 76 and 77 (see FIG. 2) detect a misalignment of the strip 12 at the bonding station 33, a signal from the sensors is transmitted to a control module 131 in a base 132 of the apparatus 28. In the control module 131, the signal is processed and, ultimately, a drive pulse is sent to the stepping motor 129 to correct the detected misalignment.

Figure 7:
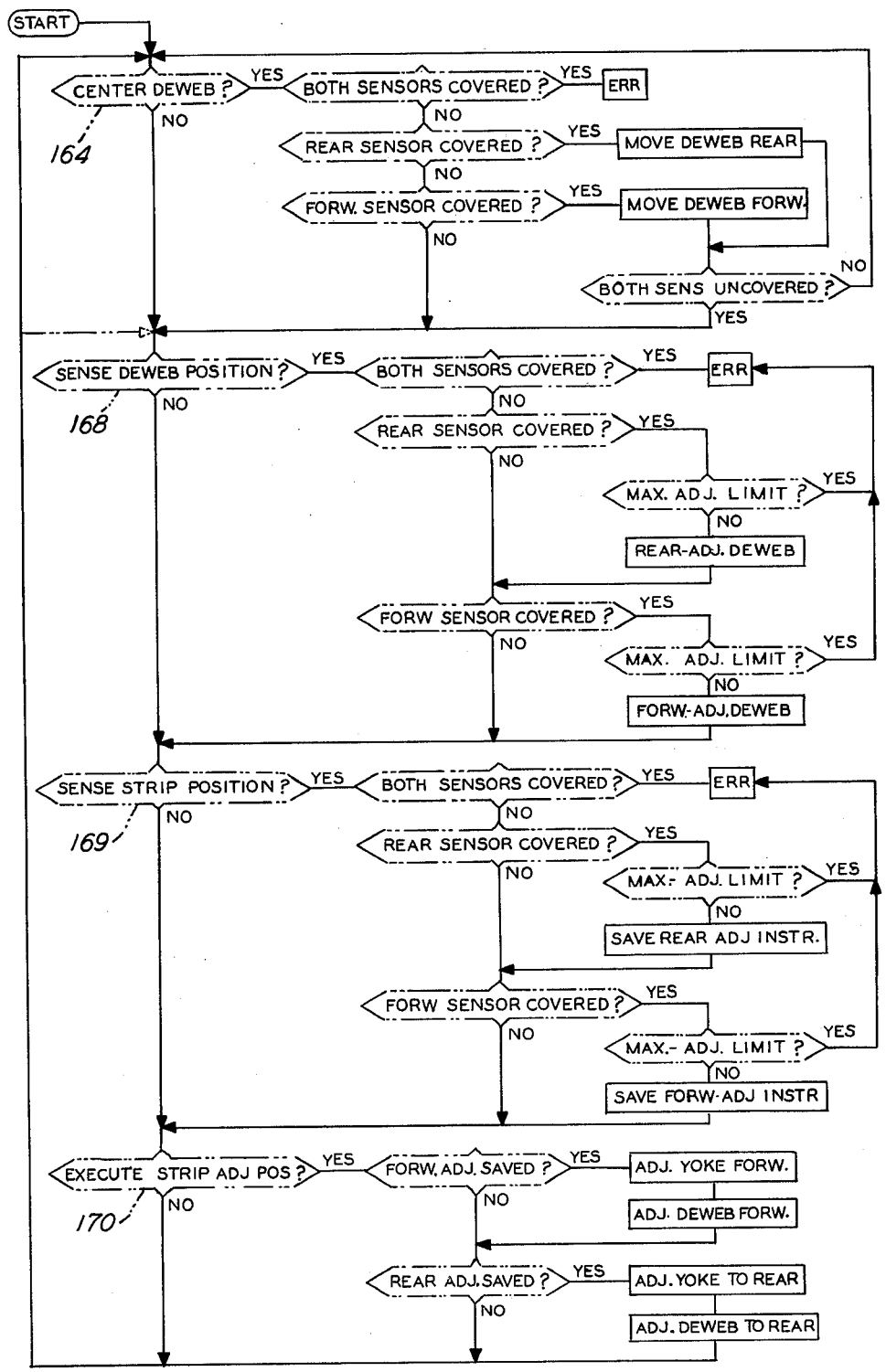
FIG. 7 is a flow diagram of a control sequence of the operation of various mechanisms of the apparatus of FIG. 2.

U.S. Pat. No. 3,914,356 entitled "Methods of and Apparatus for Controlling the Thickness of an Annular Extrusion," issued Oct. 2, 1975, to M. R. Dembiak et al., discloses in detail control methods and associated circuits and apparatus to process first input signals and apply them, conditioned by second input signals, to control the apparatus. The Dembiak et al. patent describes, in particular, controlling the thickness and shape of an annular extrusion. Similar fixed-wiring logic circuits or "hardware" may be used to process the control signals to ultimately drive the stepping motor 129. However, in accordance with the present state of the art, a "software" control, or programmable control, executed through a microprocessor-controlled microcomputer is preferred to be used in the control module 131. FIG. 7 shows a flow chart of control routines which, in a preferred embodiment, are executed by a microcomputer in the control module 131 to control the automatic strip alignment features described herein.

Referring to FIG. 4, the stepping motor 129 is activated, in the preferred embodiment, to make an alignment correction while the strip 12 is being indexed. During that time period of the operational cycle of the apparatus 28, the projection 108 of the support block 97 has moved away from the back stop 111 and is moving toward the forward stop 109. Consequently, the yoke 112 is not pressed against the threads of the lead screw 127 by the force of the lever 99, and friction forces of such contact cannot impede the motion of the stepping motor 129. Thus, in the preferred embodiment, an alignment is effectuated during the subsequent index movement of the strip 12 after a misalignment has first been detected.

After an initial alignment of the strip 12 to the bonding station 33, any misalignment whether caused by thermal expansion or contraction of the strip 12 or for other reasons is typically small and does occur to any noticeable extent over a period of several index cycles. However, a dust particle lodged over the apertures 81 or 82 of the sensors 76 or 77 may temporarily give an indication of the strip 12 being out of alignment. To prevent a false adjustment of the yoke 112 because of an erroneous signal from one of the sensors, the stepping motor 129 is preferably pulsed only once during each cycle for which the necessity of an adjustment was indicated prior to the beginning of such cycle.

Limiting the increment of adjustment of the strip 12 to a single pulse of the stepping motor for each feed cycle is one of a number of options within the scope of the invention. In the preferred embodiment the sensors 76 and 77 perform a qualitative function in that the output signal indicates whether or not there is a misadjustment of the strip 12 and in which direction of the strip a correction has to be made. A predetermined correction increment of 0.025 mm has been found to be satisfactory to maintain the strip 12 in proper alignment. It is, however, possible to substitute for the sensors 76 and 77 with their digital output similar sensors which yield a proportional signal depending on the magnitude of misadjustment of the strip 12. The magnitude in the correction of the yoke 112 would then be proportional to the magnitude of the sensed misalignment. Of course, even with the presently preferred digital sensors 76 and 77 the magnitude of the increment may be increased by pulsing the motor more than one single step during each feed cycle. An adjustment increment may also be of a first greater magnitude when a misadjustment of the strip is first detected, and of a second magnitude (for example, one half of the first) in the opposite direction once an overcorrection is detected after the initial correction.

Also, as an additional safety measurement, a stream of compressed air is further directed from nozzles 134 (one set of which is shown in phantom lines in FIG. 3) against the apertures 81 and 82 during each operational cycle to permit the combination of the movement of the strip 12 and the stream of air to maintain the apertures 81 and 82 free of any light-reflecting dust particles. Thus, if an erroneous misalignment signal has activated the stepping motor 129 and moved the strip 12 out of alignment by only a single step, such a temporary misalignment is within tolerance limits and is not detrimental to the alignment of the lead frames 14 at the bonding station 33. The misalignment is also only temporary, in that the sensors 76 and 77 will, during a subsequent cycle, after the dust particle has been removed from the aperture 81 or 82, send a correcting signal if an alignment correction of the strip 12 has indeed become necessary.

Dewebbing Station Adjustment

As a result of adjusting the position of the yoke 112 relative to the apparatus 28, the position of the strip 12 is shifted relative to the dewebbing station 65 (see FIG. 2). If initially an adjustment of the yoke 112 in the direction toward the dewebbing station was necessary because of an expansion of the strip 12, then at least a similar adjustment may be necessary to retain the position of the frames 14 in the strip relative to the dewebbing station 65.

Figure 6:
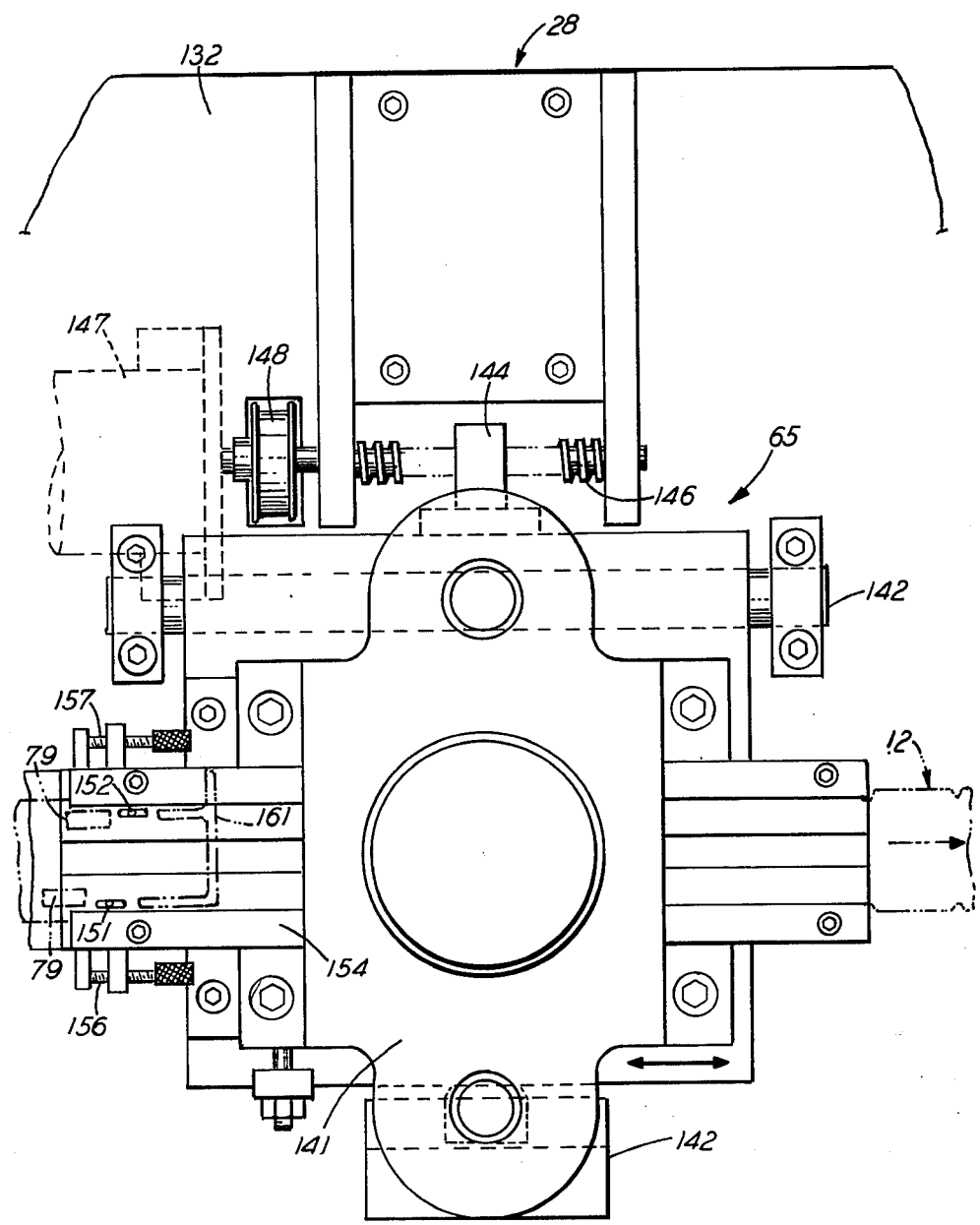
FIG. 6 shows a dewebbing mechanism of the apparatus of FIG. 2 in greater detail.

In reference to FIGS. 2 and 6, a punch-and-die head 141 of the dewebbing station 65 is mounted to a slide base 142. The base 142 allows the position of the head to be adjusted in the direction of movement of the strip 12. A threaded lug 144 of the punch-and-die head 141 rides on a lead screw 146 mounted to the apparatus 28. The lead screw 146 is either directly coupled to a stepping motor 147, or the stepping motor may be coupled to the lead screw 146 through a timing belt 148, as it is shown in FIGS. 2 and 6. Preferably the amount of adjustment of the punch-and-die head 141 for each pulse of the motor 147 is equal to the adjustment in the feed mechanism 46 (see FIG. 2) for each pulse of its motor.

The alignment of the lead frames 14 with the punch-and-die head 141 of the dewebbing station 65 is ascertained in a manner similar to that in which the alignment of the frames 14 with the bonding station is sensed. Two opto-electric sensors 151 and 152, like the sensors 76 and 77, are mounted in a guide portion 154 which is attached to and immediately precedes the punch-and-die head 141. The sensors 151 and 152 are located in momentary reference to FIG. 1 along the centerlines 83 and 84 of the feed holes 74 in the strip 12. The sensors 151 and 152 are also adjustably held in the guide portion 154 to be longitudinally movable by thumb screw adjustment mechanisms 156 and 157, as shown in FIG. 6. It should be realized, however, that like the micrometer adjustment of the sensors 76 and 77, the micrometer thumb screws 156 and 157 need to be adjusted only in an initial set up adjustment of the apparatus 28.

After such initial adjustment to position the sensors 151 and 152 along the centerlines 83 and 84 within two feed holes 74 and 75 adjacent to mutually opposite leading and trailing edges of such holes 74, the positions of the sensors 151 and 152 need not be changed except during routine repair adjustments. The alignment of the dewebbing station 65 to the frames 14 during the operation of the apparatus 28 is automated. The sensors 151 and 152 detect any misalignment of strip 12 with respect to the dewebbing station 65 in the same manner as the sensors 76 and 77 detect a misalignment of the frames with respect to the bonding station 33. Control signals from the sensors 151 and 152 are processed by the control module to pulse the stepping motor 147 to correct the alignment.

Similarly to the incremental and limited adjustment of any misalignment of the strip 12 with respect to the bonding station 33, the amount of adjustment of the dewebbing station 65 with respect to the strip 12 is also limited to a predetermined number of pulses of the stepping motor 147. The limit on the amount of adjustment of the dewebbing station 65 during each cycle of the apparatus 28 avoids a total misadjustment of the dewebbing station 65 should one of the sensors 151 or 152 become blocked by a reflective dust particle. The chance of incurring such a blockage is, of course, minimized by an air nozzle 161 directing streams of air toward the sensors 151 and 152, as shown in FIG. 6.

The Adjustment Routine

Various interactions of elements of the apparatus 28 in preparation for and during its operational cycle are best described in relationship to the flow diagram of FIG. 7. Any reference to the previously described elements of the apparatus 28 in the following description relating to the flow diagram of FIG. 7 will be made with the identifying numerals of such elements as an aid for referring back to other figures of the drawing, should such reference be desirable.

FIG. 7 is a flow diagram of a preferred decision process exercized by the control module 131 using various control signals which are generated during each operational cycle of the apparatus 28. The control module 131 makes in rapid sequence four major decision tests which are set forth in FIG. 7. The "Center Deweb" decision, identified by numeral 164 is a preferred, yet optional, test which is answered in the affirmative only before the apparatus 28 enters into automatic operation and only when an operator presses a "Center Deweb Station" pushbutton 165 on a control panel 166 (See FIG. 2). The ensuing centering of the dewebbing station 65 is a preferred, final check on the alignment of the dewebbing station 65 with the frames 14 of the strip 12.

In accordance with the principles of this invention, one or more additional workstations may be added to the apparatus 28 and become aligned with respect to the strip 12. Since operations on the strip 12 by each such further station give rise to any alignment problems, the alignment of each such workstation such as the dewebbing station 65 need only be made with respect to the strip 12 and not with respect to any other station. Thus, if further workstations were to be added to the apparatus 28, each of such further stations could be aligned in a manner identical to the alignment procedure of the dewebbing station 65.

If the centering pushbutton 165 is depressed, an error condition is found if both sensors 151 and 152 (see FIG. 6) are covered. The error condition "ERR" is indicated by an indicator 167 shown in FIG. 2 on the control panel 166, and the start-up of the apparatus 28 is blocked until the error condition is corrected by manual adjustments. Similar "ERR" conditions may occur and be detected by various other test routines as, for example, an inspection of the flow diagram in FIG. 7 indicates. If an "ERR" condition occurs at any time during the operation of the apparatus 28, the control module 131 will shut down the operation of the apparatus 28 immediately with an appropriate indication that an "ERR" condition has occurred.

In the absence of such "ERR" condition, the test 164 proceeds to test whether one or the other of the sensors 151 and 152 are covered by the strip 12 and proceeds then with a step-by-step centering adjustment of the dewebbing station 65 until both sensors 151 and 152 are located uncovered within their respective feed holes 74 of the strip. However, if the center position of the dewebbing station is not reached within a reasonable number of adjustment pulses imparted to the stepping motor 147, a manual realignment of the apparatus may be desirable.

When the dewebbing station 65 is centered, the queries of the adjustment routine executed by the control module 131 proceed in sequence to a "Sense Deweb Position" test 168, a "Sense Strip Position" test 169, an "Execute Strip Adjustment Position" test 170 before returning in a loop to the "Center Deweb" test 164. It must be realized that, except for real time delays when the described centering of the dewebbing station 65 takes place under manual pushbutton control, the queries of the adjustment routine are repeated in rapid sequence of at least 100 loop cycles per second even when adjustments of the strip 12 and the dewebbing station 65 are executed.

Except for the "Center Deweb" test 164, none of the tests require a manual input signal. For the "Sense Deweb Position" test to be answered in the affirmative, an input signal of a closing contact from the cam switch 42 (see FIG. 2) needs to be present. The contact for the dewebbing station 65 closes when the drive shaft 41 has cycled through 290 degrees of each respective cycle. The "Sense Deweb Position" test 168, consequently requires the apparatus 28 to be operating before the test can initiate any automatic adjustment of the dewebbing station.

An affirmative outcome on the "Sense Deweb Position" test 168 causes the adjustment routine to execute three successive queries, provided each of the first queries are answered in the negative. The first query, as shown in FIG. 7, checks whether both sensors are covered. Whenever both sensors are covered, the strip may have tangled, or some other emergency may exist. An error alarm condition "ERR" is therefore indicated by the indicator 167 and the apparatus 28 is shut down immediately. If the first query is answered in the negative, which is expected under normal running conditions, the next two queries check whether an adjustment of the dewebbing station 65 has become necessary.

If an adjustment of the dewebbing station 65 is found to be necessary, a sub-test determines whether the dewebbing station 65 has already been adjusted to a predetermined, maximum excursion from its initial, centered position. The extent of such predetermined maximum excursion is a matter of choice. The test represents a safety check to prevent repeated erroneous adjustments of a single pulse each to be made in consecutive cycles of the apparatus 28, to accummulate in a gross misadjustment.

A safety limit of, for example, 25 adjustment pulses is therefore established. Each time an adjustment of the position of the dewebbing station 65 is made by pulsing the stepping motor 147 in one direction or the other, a total count of pulses is updated by the control module 131. The control module updates a stored count by adding or subtracting the most recent pulse of the stepping motor, depending on its direction. Once the total count exceeds 25 in one direction or the other, an error condition (ERR) is indicated and the operation of the apparatus 28 shuts down.

For a successful operation of the apparatus 28, the number of steps to establish the maximum count to enter such error condition should be based on reasonable assumptions. For example, 25 steps of the stepping motor 147 represent approximately 0.6 mm expansion or contraction of the strip 12 between the bonding station 33 and the dewebbing station 65. This distance slightly exceeds a maximum expected thermal expansion or contraction of the strip 12 between the bonding station and the dewebbing station under normal operating conditions of the apparatus 28.

If such a predetermined limit has not been reached, and during the normal operation of the apparatus 28 the maximum limit is not expected to be reached, the respective adjustment of the dewebbing station 65 is made. The routine proceeds in its queries as soon as the appropriate adjustment of the dewebbing station, either in the forward direction or to the rear, is initiated.

The next query by the adjustment routine is the "Sense Strip Position" test 169, which determines whether the strip 12 is correctly aligned at the bonding station 33. The test 169 is based on control signals from the sensors 76 and 77 when the strip 12 is at rest. The "Sense Strip Position" test is therefore only answered in the affirmative when a predetermined contact of the cam switch 43 is closed. The closing of the contact of cam switch 43 preferably occurs at 240 degree rotation of the drive shaft 41 as soon as the index feed mechanism 46 has completed its movement to advance the strip 12 by two lead frames 14.

Once the initial query of the "Sense Strip Position" test 169 is answered in the affirmative, the adjustment routine branches to a sequence of three sub-tests, which are expected to be answered in the negative, if no adjustment of the strip 12 with respect to the bonding station 33 is necessary. The first query is, again, a safety check to determine whether both sensors are covered. And as described above, if this condition is found to exist the control module 131 registers an error condition (ERR) and the apparatus 28 shuts down immediately. However, with a proper set-up adjustment of the sensors 76 and 77, this condition is not expected to be entered into during a normal operation of the apparatus 28.

The next two queries of the "Sense Strip Position" test 169 determine, respectively, whether an adjustment of the strip 12 to the rear, or in the forward direction has become necessary. If any of the two queries are answered in the affirmative, a sub-test checks whether a maximum adjustment limit of the strip 12 with respect to the bonding station 33 has been reached. As previously described with respect to the automatic adjustment of the dewebbing station 65, such a maximum adjustment limit is predetermined in terms of total number of adjustment pulses of the stepping motor 129 in one direction or the other from an initially established optimum position of the strip 12. Because of a smaller distance between the bonding station 33 and the index feed mechanism 46 than between the bonding station and the dewebbing station 65, the number of pulses necessary to reach the maximum adjustment limit of the strip 12 may be less than those in the adjustment of the dewebbing station 65, such as, for example, 20 pulses.

The routine for adjusting the strip 12 with respect to the bonding station 33 differs from the routine for adjusting the dewebbing station 65 in that the position of the strip 12 is sensed immediately after the strip has been advanced, but the position of the strip 12 is not changed with respect to the bonding station 33 until the index feed mechanism 46 advances the strip 12 again. Consequently after the query whether the maximum adjustment limit of the strip 12 has been reached is answered, as expected in the negative, an instruction to adjust the position of the strip 12 either in the forward direction or toward the rear is saved, or stored in memory. As long as such instruction remains stored in memory, the "Sense Strip Position" test 169 will be answered in the negative during subsequent query loops. The "Execute Strip Adjustment Position" test 170 will not be answered in the affirmative until after the drive shaft 41 (see FIG. 2) has completed its current cycle and the reciprocating lever 99 begins to advance the support block 97 with the strip 12 during the next following cycle of operation. At that time, In the preferred embodiment at 35 degrees of rotation of the drive shaft 41, the cam switch 43 returns to its unoperated state and the test 170 is now answered in the affirmative.

The adjustment routine now branches to two subtests, namely to determine whether a forward adjustment instruction or whether an instruction to adjust the strip 12 toward the rear had been saved. If either of the two queries is answered in the affirmative, an adjustment pulse in one direction or in the other is imparted to the stepping motor 129. Simultaneously therewith, an adjustment pulse is sent to the stepping motor 147 to move the dewebbing station in the same direction as that in which the yoke 112 is being moved. Moving the dewebbing station in the same direction as the rest position of the strip 12 tends to minimize additional adjustment needs on the dewebbing station 65. It is anticipated by the adjustment routine that any adjustment of the rest position of the strip 12 also requires a like adjustment on any station the precise position of which is typically referenced to the rest position of the strip 12. If an additional adjustment of the dewebbing station 65 becomes necessary, such additional adjustment is initiated during a subsequent cycle of the apparatus 28.

Safety Shutdown

The flow diagram of FIG. 7 includes routines for detecting certain out-of-adjustment errors, and for shutting down the operation of the apparatus 28 upon detection of such errors (ERR). Immediate detection of possibly damaging conditions and an immediate shutdown of the apparatus are desirable for automatic operation with a minimum of supervision.

The possibility of an occurrence of an error condition in the strip handling process and apparatus has been discovered, which may remain undetected by the above-described strip adjustment routines. The strip 12 may become jammed or hung up, for example, at the locating pins 73 of the bonding station 33. If that happens, the strip 12 is likely to remain in perfect alignment with the sensors 76 and 77 at the bonding station, and also with the sensors 151 and 152 at the dewebbing station 65. The described adjustment routines consequently fail to recognize an error condition. Yet, the strip 12 and, more importantly, the index feed mechanism 46 are likely to become damaged during any subsequent operation of the index feed mechanism to advance the strip 12.

In reference to FIG. 4, during the index feed cycle, the lever 99 is driven by the barrel cam 102 toward the right (in the direction of the arrows 176) to advance the feed head 61 in the indicated direction. The free end 104 of the lever 99 thereby bears against the spring-loaded drive pin 107. The predetermined spring force of a spring 177 exceeds the maximum permissible resistive force of the strip 12 to the index movement. Therefore, while the feed head 61 freely advances the strip 12 during a normal operation, a shoulder 178 on the pin rests solidly against an internal shoulder or ledge 179 in a guide passage 181 of the support block 97.

At the end of the permissible travel of the feed head 61, the projection 108 trips the switch 113 and comes to rest against the forward stop 109 of the yoke 112. Further travel of the lever 99 bears against the pin 107, the positive motion of the lever driving the pin 107 outward against the resilient urging force of the spring 177. The movement of the pin drives a cantilever-mounted leaf spring 182 outward away from a biased rest position wherein the spring 182 remains urged against an outer end plate 184 of the support block 97. In such rest position an upper, free end 186 of the leaf spring 182 maintains an actuator 187 of a limit switch 188 normally depressed. However, upon movement of the leaf spring 182 away from its rest position, the free end 186 releases the actuator 187 of the limit switch 188.

During a typical operational cycle of the feed mechanism 46, the limit switch 113 necessarily becomes tripped before the actuator of the limit switch 188 is released. The sequence of the switch 113 tripping before the switch 188 becomes released is recognized by the control module 131 as an indication that the strip 12 has advanced one full increment of two lead frames 14. If, however, the strip 12 becomes hung up at the bonding station 33, an attempt by the feed mechanism 46 to pull the strip 12 fails. The level 99, however, by moving in the direction of the arrow 176, pushes the pin 107 relative to the support block 97. Since the block 97 is held back by the hung up strip 12, the pin 107, in turn, pushes the free end 187 of the leaf spring away from the limit switch 188. Since, in the absence of the switch 113 being triggered, the change of state of the switch 188 is recognized by the control module 131 as an indication of a malfunction occurring in the feeding of the strip. The operation of the apparatus 28 is consequently shut down immediately before any further motion of the cam 102 can damage any part of the apparatus 28.

With respect to the above description of the strip feeding provisions of the apparatus 28, in relationship to the bonding station 33 and the dewebbing station 65, it should be understood that various workstations may be added, without departing from the spirit and scope of the present invention. The referred to notching station 54 (see FIG. 2) may, for example, be mounted ahead of the bonding station on a slidable support similar to the slide base 142 of the dewebbing station 65. A precise alignment of the notching station 54 with respect to the strip 12 could then be achieved in a manner similar to that of the dewebbing station 65. Various other changes in the described apparatus and in the methods of aligning the strip 12 to the workstations are possible within the spirit and scope of this invention.

What is claimed is:

1. A method of indexing a repetitively patterned strip past a plurality of work stations, which comprises:
   sensing the position of a pattern in the strip relative to a desired position of such pattern with respect to a first work station;
   deterining whether there is a deviation of the sensed postion of such pattern from such desired position of the pattern with respect to such first work station;
   feeding the strip by an indexing movement of an incremental feed mechanism between two travel limit stops of such feed mechanism;
   upon determination of the existence of any such deviation, adjusting the position of said travel limit stops of the feed mechanism by an increment in a direction to decrease any such deviation of the sensed position of such pattern; and
   simultaneously with any such adjustment of said travel limit stops, adjusting the position of at least one second work station located along a path of said strip in the same direction and by an increment of the same magnitude along the path of said strip as the increment of adjustment on said travel limit stops.

2. A method of indexing a repetitively patterned strip past a plurality of work stations according to claim 1, wherein the increment of adjustment of the travel limit stops is a predetermined increment which is independent in its magnitude of the magnitude of said deviation of the sensed position of such pattern from said desired position.

3. A method of indexing a repetitively patterned strip past a plurality of work stations according to claim 1, wherein the travel limit stops are adjusted simultaneously with the movement of the feed mechanism during the step of feeding the strip.

4. A method of indexing a repetitively patterned strip past a plurality of work stations according to claim 3, further comprising:
   upon completing the indexing movement of the strip during the step of feeding the strip, sensing the position of a pattern in the strip relative to a desired position of such pattern with respect to said at least one second work station;
   determining whether there is a deviation of the sensed position of such pattern from such desired position of such pattern with respect to said at least one second work station; and
   upon determining the existence of any such deviation of the position of such pattern from such desired position with respect to said at least one second work station, adjusting the position of said at least one second work station in a direction to decrease any such deviation with respect to said at least one second work station.

5. Apparatus for indexing a repetitively patterned strip past a plurality of work stations, which comprises:
   means for sensing the position of a pattern in the strip relative to a desired position of such pattern with respect to a first work station of the plurality of work stations;

means for determining whether there is a deviation of the sensed position of such pattern from such desired position of the pattern with respect to such first work station;

means for feeding the strip by an indexing movement said strip feeding means including two travel limit stops for determining the extent of the indexing movement;

means, selectively operable upon determination of the existence of any such deviation, for adjusting the position of said travel limit stops of the strip feeding means by an increment in a direction to decrease any such deviation of the sensed position of such pattern; and means, operable simultaneously with said means for adjusting said travel limit stops, for adjusting the position of at least one second work station of the plurality of work stations located along a path of said strip in the same direction and by an increment of the same magnitude along the path of said strip as the increment of adjustment on said travel limit stops.

6. Apparatus for indexing a repetitively patterned strip past a plurality of work stations according to claim 5, comprising means for selectively operating the travel limit adjusting means simultaneously with the operation of the strip feeding means to advance the strip.

7. Apparatus for indexing a repetitively patterned strip past a plurality of work stations according to claim 6, wherein said means for sensing the position of a pattern in a strip comprises:

a first optical sensor mounted in the path of the strip and with respect to the first work station to sense a leading edge of material in the pattern of the strip relative to the direction of movement of the strip when such a pattern of the strip is substantially in said desired position relative to said first work station; and a second optical sensor mounted in the path of the strip and with respect to the first work station to sense a trailing edge of material in the pattern of the strip relative to the direction of movement of the strip when such pattern of the strip is substantially in said desired position relative to said first work station, such first and second sensors being positioned toward each other along the direction of movement of the strip by a distance equal to a predetermined tolerance in the desired position of the pattern relative to the first work station, whereby the desired position of the pattern relative to the first work station is indicated by said first and second sensors generating identical output signals.

8. Apparatus for indexing a repetitively patterned strip past a plurality of work stations, comprising:

a base adapted to support the plurality of work stations in sequential alignment;

means for guiding the strip along a path along the base into working relationship with said plurality of work stations;

a feed head movably mounted to the base and adapted for reciprocating movement along the path of the strip, the feed head including means for selectively engaging and disengaging the strip within a cycle of such reciprocating movement to index the strip in a desired direction;

means, mounted to the base, for reciprocatably driving the feed head, such driving means having motion transfer element in engagement with the feed head, such motion transfer element having a free, linear excursion along the path of reciprocating movement which exceeds the desired increment for advancing the strip;

means, mounted to the base, for arresting the reciprocating movement of the feed head in both directions of travel after a predetermined distance of travel, to thereby determine the increment for advancing the strip during each cycle of reciprocating movement by the feed head;

first sensing means for sensing the position of a pattern in the strip relative to a desired position of such pattern with respect to a first work station of a plurality of the work stations;

means, responsive to such first sensing means sensing a deviation in the position of the pattern from such desired position with respect to such first work station, for adjusting the position of the arresting means with respect to the base in a direction opposite to such deviation, whereby the pattern in the strip becomes relocated toward a desired alignment with respect to such first work station; and means, responsive to said first sensing means sensing a deviation in the position of the pattern from such desired position with respect to such first work station, for adjusting the position of at least one second work station of the plurality of work stations in the same direction as that of the adjustment of the arresting means.

9. Apparatus for indexing a repetitively patterned strip past a plurality of work stations according to claim 8, wherein the feed head comprises:

a support block, movably mounted to the base, the support block having facing, spaced and inwardly biased resiliently yielding first and second drive elements, said drive elements exerting an inward bias force to resist yielding under an outward driving force for advancing the strip, the support block further having an upper support surface adapted to support a segment of the strip in contact with such support surface; and the means for selectively engaging and disengaging the strip in a jaw, mounted to the support block above the support surface for vertical movement away from and toward the support block, the jaw having downwardly depending feed pins adapted to extend through feed holes of the strip upon a movement of the jaw toward the support block to thereby engage the strip, and adapted to pull free of such feed holes upon movement of the jaw away from the support block to thereby disengage the strip, the means for selectively engaging and disengaging the strip including means for moving the jaw toward the support block prior to said driving means moving the feed head in the direction of movement of the strip and for moving the jaw away from the support block after said driving means has completed moving the feed head in the direction of movement of the strip.

10. Apparatus for indexing a repetitively patterned strip past a plurality of work stations according to claim 9 wherein the means for arresting the reciprocating movement of the feed head comprises:

a yoke having a back stop and a forward stop, the back stop and the forward stop having stop surfaces facing each other, said surfaces being spaced by a predetermined distance which equals the sum of a predetermined fixed increment by which the strip is to be indexed and of the thickness of a predetermined portion of the feed head positioned to be located between the back stop and the forward stop to reciprocate between a position in contact with the stop surface of the back stop and the stop surface of the forward stop, whereby the movement of the feed head with respect to the yoke is limited to the predetermined fixed increment by which the strip is to be indexed.

11. Apparatus for indexing a repetitively patterned strip past a plurality of work stations according to claim 10, wherein the yoke includes a threaded lug, and wherein the means for adjusting the position of the arresting means comprises:
  a slide track mounted to the base in an interposed position between the base and the yoke;
  a lead screw rotatably mounted to the slide track, the lead screw extending through and threadedly engaging the threaded lug of the yoke; and
  a rotary index mechanism coupled to the lead screw for rotating the lead screw through predetermined fractions of a complete revolution, whereby the position of the lug, and hence of the yoke, becomes adjusted in the direction wherein the strip extends.

12. Apparatus for indexing a repetitively patterned strip past a plurality of work stations according to claim 9, further comprising:
  second sensing means for sensing that the means for arresting the reciprocating movement of the feed head has arrested the feed head upon advancing the strip by the predetermined increment;
  third sensing means for sensing a force resisting the movement of the feed head in the direction for advancing the strip and greater than a force required for advancing the strip; and
  means, responsive to the third sensing means, sensing a force greater than a force required for advancing the strip prior to the second sensing means sensing that the means for arresting the reciprocating movement of the feed head has arrested the feed head, for terminating further operation of said apparatus.

13. Apparatus for indexing a repetitively patterned strip past a plurality of work stations according to claim 9, further comprising:
  means, responsive to said first sensing means sensing a deviation in the position of the pattern from such desired position with respect to such first work station, for inhibiting the operation of the adjusting means; and
  fourth sensing means, coupled to the driving means, for sensing that the driving means is reciprocatably driving the feed head and responsive to sensing such driving motion of the driving means, for disabling the inhibiting means and thereby permitting the adjusting means to adjust the position of the arresting means, upon such first sensing means having sensed a deviation in the position of the pattern from such desired position with respect to such first work station.

* * * * *